United States Patent
Grunwald et al.

(10) Patent No.: US 6,632,588 B2
(45) Date of Patent: *Oct. 14, 2003

(54) DIRECT IMAGING PROCESS FOR FORMING RESIST PATTERN ON A SURFACE AND USE THEREOF IN FABRICATING PRINTING PLATES

(76) Inventors: John J. Grunwald, 4 Hameshorer Street, Kirya Krinizi, Ramat Gan (IL); Shulamit Hirsh, 13 Usha Street, Tel Aviv (IL); Chava Gal, Halonim Street, Ramat Hasharim (IL)

( * ) Notice: Subject to any disclaimer, the term of this patent is extended or adjusted under 35 U.S.C. 154(b) by 28 days.

This patent is subject to a terminal disclaimer.

(21) Appl. No.: 10/190,873

(22) Filed: Jul. 8, 2002

(65) Prior Publication Data

US 2003/0003406 A1 Jan. 2, 2003

Related U.S. Application Data

(63) Continuation of application No. 08/804,384, filed on Feb. 21, 1997, now abandoned, which is a continuation of application No. 08/546,790, filed on Oct. 23, 1995, now Pat. No. 5,641,608.

(51) Int. Cl.⁷ .................................................. G03F 7/00
(52) U.S. Cl. ........................ 430/302; 430/325; 430/944; 430/945; 430/964
(58) Field of Search ............................... 430/300, 302, 430/306, 307, 325, 944, 945, 964

(56) References Cited

U.S. PATENT DOCUMENTS

| 5,149,613 A | | 9/1992 | Stahlhofen et al. |
| 5,340,699 A | * | 8/1994 | Haley et al. ................. 430/302 |
| 5,631,119 A | | 5/1997 | Shinozaki |
| 5,641,608 A | | 6/1997 | Grunwald et al. |

* cited by examiner

Primary Examiner—John A. McPherson
(74) Attorney, Agent, or Firm—Carmody & Torrance LLP

(57) ABSTRACT

A process is described for the direct production of an imaged pattern of resist on a substrate surface (such as a pattern of etch-resistant organic resin material on the surface of a copper-clad dielectric in connection with a printed circuit board (PCB) fabrication process or in the process of producing printed plates), which process utilizes thermo-resists rather than photoresists, i.e., compositions which undergo thermally-induced, rather than photo-induced, chemical transformations. A film of thermo-resist composition applied to the substrate surface is scanned by a focused heat source (e.g., a thermal laser emitting in the IR region) in a predetermined pattern, without a phototool, to bring about localized thermally-induced chemical transformations of the composition which either directly produce the resist pattern or produce in the film a developable latent image of the pattern.

6 Claims, No Drawings

DIRECT IMAGING PROCESS FOR FORMING RESIST PATTERN ON A SURFACE AND USE THEREOF IN FABRICATING PRINTING PLATES

CROSS-REFERENCE TO RELATED APPLICATIONS

This application is a continuation of U.S. patent application Ser. No. 08/804,384, filed on Feb. 21, 1997, now abandoned, which is a continuation of U.S. patent application Ser. No. 08/546,790, filed Oct. 23, 1995, now U.S. Pat. No. 5,641,608.

BACKGROUND OF THE INVENTION

The present invention relates to the formation of a resist pattern on a substrate surface by a direct imaging process (i.e. without use of a phototool), and more particularly to the use of such direct imaging process in the fabrication of a printed circuit board.

A printed circuit board (PCB) fundamentally consists of a substrate made of dielectric material (such as epoxy, polyimide or the like, typically glass-reinforced) carrying a pattern of conductors on one or both of its faces. As used herein, PCBs are intended to include simple single- or double-sided PCBs; single- or double-sided innerlayer PCBs for use in fabricating multilayer PCBs; and multilayer PCBs per se.

Numerous techniques have been developed for forming the conductor pattern of PCBs, including subtractive techniques, additive techniques, and techniques involving both additive and subtractive aspects. Common to such methods is the reliance upon a patterned resist to define (either positively or negatively) selected surfaces of the board which will serve as the conductor pattern. Thus, for example, a dielectric substrate surface can be patterned with resist in the negative of the desired conductor pattern, followed by metal plating of the areas not covered by resist so as to provide the conductor pattern, followed by removal of the resist. In a more commonly employed method, the starting material is a dielectric having a metal layer (e.g., copper) covering one or both of its faces, and over which metal layer is arranged a resist pattern in the positive of the desired circuitry pattern. The metal areas not protected by resist are etched away down to the dielectric substrate surface, whereupon subsequent removal of the resist reveals the desired conductor pattern. In another common technique, the metal-clad dielectric is patterned with a first resist in the negative of the desired conductor pattern; the non-resist covered areas are then built up with further metal; the so-metallized patterned areas then protected by a second resist in the same pattern; the first resist then removed and the metal previously thereunder etched away; and the second resist then removed to reveal the desired conductor pattern.

Apart from resists utilized in the foregoing manners (in which uses they typically are referred to as "primary" resists), resists also are utilized to provide a permanent coating (known as a "solder mask") over selected surface areas of a PCB so as to protect these areas from corrosion, oxidation, etc., and to protect them during subsequent soldering steps carried out on the PCB. Use of resist in this manner often is referred to as a "secondary" resist.

The provision of necessary resist patterns in fabricating PCBs is at present effected almost exclusively with photoresists. Photoresists are applied to surfaces in question in the form of a film, but not directly in the ultimately desired resist pattern. Rather, the composition of the photoresist is such that it undergoes photo (light)-initiated change when exposed to a radiation source of appropriate wavelength (typically, UV radiation). Thus, by selective imagewise exposure of the photoresist film to radiation, there is created in the film a latent image which can then be developed to provide the desired resist pattern.

In particular, photoresists are formulated of photosensitive compositions such that the photo-initiated change which occurs upon exposure to activating radiation is to render the exposed areas differentially more or differentially less soluble in a developer than unexposed areas. The solubility difference thereby permits areas of the photoresist film to be selectively removed with developer while leaving behind other areas which serve as the resist pattern.

Photoresists may be either "positive"-working or "negative"-working. A positive photoresist is one in which the exposure to UV light irradiation brings about photo-initiated reactions which cause the so-exposed areas to become differentially more soluble in developer than the unexposed areas. These reactions may, e.g., be in the nature of a photo-induced depolymerization of polymeric resin materials in the composition through breaking of chemical bonds in the polymer chain; or photo-induced change in the structure of a compound present in the composition which enables the entirety of the composition, including its resin components, to become more soluble in developer; or other like reactions. A negative photoresist, on the other hand, is one in which the exposure to UV light irradiation brings about photo-initiated reactions which cause the so-exposed areas to become differentially less soluble in developer than unexposed areas, such as may occur through utilization of a composition which undergoes photo-initiated polymerization, additional polymerization or cross-linking, such as by free radical mechanisms. Accordingly, when using a positive photoresist, those portions exposed to UV light irradiation are selectively removed by developer, while in a negative photoresist, the developer selectively removes those portions which were not exposed to UV light irradiation.

For providing the necessary photoresist film used in producing primary resists, generally any of three types of photoresists can be employed. One type is known as a dry film, which is provided in the form of a pre-existing film which is then laminated to the substrate surface. See, e.g., U.S. Pat. No. 3,469,982. Dry films, which in practice are exclusively negative photoresists, are overwhelmingly preferred today in mass production of PCBs.

Another type of photoresist film is that obtained from a liquid photoresist composition (which may be a positive or negative photoresist) which is applied to the substrate as a film by roller coating, dipping, spinning or the like, followed by drying of the film to eliminate all or most of the solubilizing solvents used therein.

A third type of photoresist film is that obtained by electrophoretic deposition onto metal substrate surfaces, i.e., using a liquid photoresist composition which is formulated so as to be electrophoretically depositable. See, e.g., U.S. Pat. Nos. 4,592,816; 4,751,172; and 5,004,672.

For the provision of solder masks, the photoresists employed are predominantly liquid, negative photoresist compositions applied as a film by roller coating, curtain coating or the like. A typical process for producing a solder mask can be found in U.S. Pat. No. 4,789,620, the teachings of which are incorporated herein by reference.

The imagewise exposure of the photoresist film, i.e., the exposure of only selected portions of it to UV light irradiation to produce the desired latent image, is predominantly effected through use of an appropriately patterned mask (phototool) which permits passage of UV light there through, to the film, only in the desired locations. The difficulty with such phototools is that their preparation is very expensive and time-consuming. Moreover, the use of phototools for selective imaging imposes limits on the achievable resolution of the conductor pattern for a variety of reasons.

In recent years, attention has been directed to so-called "direct imaging" techniques for photoresists. In these direct imaging methods, the exposure of only selected areas of the photoresist film to the activating radiation needed to bring about the required photoinitiated changes in the film composition does not utilize a radiation source directed through a patterned phototool, but rather employs a suitably focused beam of such radiation (such as with a laser of appropriate wavelength light) which directly scans the film in a predetermined (computer-controlled) desired tracking pattern. See, e.g., U.S. Pat. No. 4,724,465 the teachings of which are incorporated herein by reference; Kuchta, A. D., "Technological Requirements for Direct Imaging of Photoresists", Technical Paper No. A 8/1, Printed Circuit World Convention 5 (June 1990); Meier, K., "Laser Direct Imaging In High Definition Image Transfer Processes", Technical Paper No. A 8/2, Printed Circuit World Convention 5 (June 1990). While such techniques offer potential advantages in resolution capability and avoidance of defects sometimes caused by imperfect phototool artwork and/or by operator handling of phototools, those developed to date are too slow for mass production; require expensive photoresists; and rely upon lasers which have a short life unsuited for industrial use.

In other areas direct imaging has been employed in the production of printing plates. See U.S. Pat. No. 5,310,869 (May 10, 1994), the teachings of which are incorporated herein by reference, where the printing plates are coated with a two-component silicone based formulation. The two components are combined in varying proportions with a cross linking agent to produce compositions with varying viscosities and dispersibilities. In addition reference is made to U.S. Pat. No. 5,339,737 (Aug. 23, 1994) where printing plates are produced using an ablatable material. The printing plate there is composed of one or more layers having two functions, absorption of infrared radiation and interaction with ink or ink-adhesive fluid.

SUMMARY OF THE INVENTION

A primary object of the present invention is to provide a direct imaging process for forming a pattern of resist on a substrate surface.

A more particular object of the invention is to provide patterned resists in the course of fabricating a printed circuit or printing plate, which patterned resists are provided by direct imaging of a suitably composed film in a desired predetermined pattern without use of a phototool.

Yet a further object of the invention is to provide a direct imaging process for selectively forming a desired imaged pattern in a film composition without reliance upon photosensitive materials or compositions.

These, and other objects as will be apparent, are accomplished by the provision of a process which makes use of compositions which, applied as a film to a substrate surface, can be selectively transformed through thermally-induced mechanisms which are mediated by an appropriately focused thermal energy beam which directly scans the film in a desired pattern and without use of a phototool. The so-produced selective transformations of the film composition either directly produce the desired resist pattern or produce a developable latent image thereof. In essence, the process of the invention relies upon the selective thermal inducing of compositional changes in a composition having thermally-sensitive properties as a means for producing a patterned resist from a generally unpatterned film composition, as opposed to processes which rely upon photosensitive properties of film compositions and selective light imaging thereof to produce the patterned resist.

Thermally-sensitive resist compositions for use in the invention, which are herein referred to as "thermo-resists", are of a type which undergo chemical transformation in response to exposure to, and absorption of, suitable heat energy. The nature of the thermally-induced chemical transformation may be to ablate the composition, or to increase the solubility of the composition in a particular developer, or to decrease the solubility of the composition in a particular developer. As such, selective heat exposure of predetermined areas of a film formed of the composition has the capability of directly or indirectly producing a suitably imaged pattern of composition which can serve, e.g., as a resist pattern in PCB fabrication.

In a manner similar to that with photoresists, the thermo-resists of the invention can be positive-working or negative-working. With a positive thermo-resist, the selective exposure of the composition film to an appropriately focused beam of the requisite thermal energy will either (a) ablate the so-exposed composition, in which case there is directly produced the desired resist pattern represented by the remaining film portions not exposed to the focused heat energy and thus not ablated, or (b) cause the so-exposed composition to become differentially more soluble in a suitable solvent, in which case there is produced in the film what is essentially a latent image, such that contact of the film with a suitable developer will dissolve away the heat-exposed areas and leave behind the non-heat-exposed areas as the desired pattern. With a negative thermo-resist, selective exposure of the composition film to the appropriately focused beam of the requisite thermal energy causes the so-exposed areas to become differentially less soluble in a suitable developer, such that subsequent contact with the developer dissolves away the areas not heat-exposed and leaves behind the heat-exposed areas as the desired resist pattern.

Through use of thermo-resists, the ability to produce a resist pattern on a substrate surface by direct imaging without use of a phototool is greatly enhanced because the imaging beam need only be a suitably focused source of requisite thermal energy, such as can be formed from low-cost solid state lasers, as opposed to the focused source of radiation of particular wavelength required for direct imaging of photoresists. Focused thermal energy sources, such as an infrared (IR) laser beam, are inherently better suited for use in commercial-scale operations in terms of expense, life and reliability than the UV or deep UV beams needed for direct imaging of photoresists. Moreover, thermo-resist compositions, which need undergo only thermally-induced composition change rather than photo-induced change, are inherently less complicated than photoresist compositions in direct imaging processes. As such, not only can they be formulated in the cost-effective manner needed for industrial uses such as PCB fabrication, but their simpler mechanism of operation enables operation in daylight and the attainment of the processing speeds necessary for such uses and which heretofore have not been achievable using photoresist technology relying upon photo-initiated reactions.

In accordance, then, with the present invention, a direct imaging process is provided for the production of a resist pattern on a substrate surface, comprising the steps of:

(a) applying to the surface a film of a thermo-resist composition, i.e., a composition which undergoes thermally-induced chemical transformation effective to ablate the composition or to increase or decrease its solubility in a particular developer; and then (b) in a predetermined pattern and without use of a phototool, directing to pre-selected areas of the film a suitably focused beam of thermal energy effective to there bring about the thermally-induced chemical transformation of the composition.

When the thermo-resist is one which undergoes thermally-induced ablation, the foregoing steps directly produce the desired resist pattern, as represented by the non-ablated film composition areas remaining on the surface. For the other types of thermo-resists, the steps produce essentially a latent image in the film; a subsequent step of contacting the film with the appropriate developer is then required in order to produce the desired resist pattern by dissolution from the surface of film areas which have been rendered differentially more soluble in the developer than other areas by reason of the thermally-induced composition changes.

The process has particular applicability to PCB and Printing Plate fabrication processes, for use in providing a plating resist pattern, an etch resist pattern or a solder resist pattern. For example, the thermo-resist can be applied as a film to the metal surface (or surfaces) of a metal (e.g., copper)-clad dielectric substrate; followed by the selective directing to the film of a suitably focused thermal energy beam in the desired pattern and without a phototool, such that there is directly, or after development in solvent, produced a resist pattern in the positive of the desired conductor pattern; followed then by etching away of the metal surface at those areas not covered by the resist. Removal (stripping) of the resist then reveals the desired conductor surface pattern for the PCB. In like manner, the process of the invention can be used in any PCB application for which photoresists have heretofore been employed.

According to more detailed aspects of the invention, the preferred means for focusing the requisite intensity of thermal energy to the film of thermo-resist composition so as to bring about the thermally-induced chemical transformation will be by way of an infrared (IR) beam, e.g., a laser beam emitted by a thermal laser such as a laser diode, Neodynium-Yag or $CO_2$ diode laser. Any other heat energy beam which can be focused to the extent required (as dictated by the degree of line definition involved with the particular pattern) can also be employed, such as a beam of solar light. The focused beam supplies a highly localized heat which induces the chemical transformation of the film and hence can be thought of as a "focused moving oven". The scanning of the film with the focused beam in the appropriate pattern can be controlled, e.g., by a CAD device. See, e.g., Emmel, P. M., SPIE Proceedings 2, 222 (1980).

DETAILED DESCRIPTION OF THE INVENTION

In accordance with the present invention, an imaged pattern of material suitable as a resist is provided on a surface by first providing a film of a thermo-resist composition on the surface, and then, in a predetermined pattern and without use of a phototool, directing to particular areas of the film an appropriately focused beam of thermal energy effective to bring about at such areas a thermally-induced chemical transformation of the composition, with result of either directly producing the desired imaged resist pattern or producing a developable latent image of such pattern.

In the most preferred embodiment of the invention, the appropriately focused beam of thermal energy will take the form of an IR beam produced by a thermal laser. In describing the invention hereinafter, and particular aspects of thermo-resist compositions and the like, use or the foregoing focused thermal energy will be assumed in illustration of the invention and for ease of description.

The thermo-resist compositions suitable for use in the invention are compositions which comprise polymeric components, or precursors thereof, selected so that the imaged pattern eventually produced therefrom will itself constitute a composition which possesses the physical and chemical properties suitable for its intended purpose (e.g., resistance to etchant solutions when used as an etch resist for a PCB; resistance to solder when used as a solder mask for a PCB; etc.). In addition, the thermo-resist compositions are formulated such that they possess the property of undergoing thermally-induced chemical transformation effective either to ablate the composition or to increase or decrease its solubility in a particular developer.

These thermo-resist compositions typically will be employed in liquid form in association with a suitable organic solvent, and will be applied to the surface in question as a film, having a thickness of e.g., from about 10–100 micro meters, by any suitable method. After application, the thermo-resist film will be dried under conditions suitable to evaporate all or most of the solvent (and avoiding, of course, any conditions which might prematurely bring about the thermally-induced chemical transformations later involved in the direct imaging process). As with photoresists, the thermo-resists also can be formulated so as to be electrophoretically deposited onto conductive surfaces, such as the copper-clad surface of a printed circuit board material. The thermo-resist compositions also can be provided in the form of a dry film, in which case the film will be applied to the surface in question by suitable lamination technique.

Printing plates, particularly offset printing plates, of concern to this invention consist of a minimum of 3 layers. The first layer is the substrate which provides structure and rigidity. The next layer is an I.R. absorbing layer of obsolete material. This layer is advantageously composed of compositions of the current invention. The top layer is composed of a silicone polymer which repels ink. Optionally an adhesion promoter and a secondary ablation layer can be interposed between the substrate and the main I.R. absorbing ablatable layer discussed above.

The printing plates are then scanned in the desired pattern with an I.R. laser to ablate portions of the upper layers and create the desired image. Once scanned the printing plate is cleaned by wiping with alcohol. At this point the plate may optionally be further cured by oven heating and is then ready for use in an offset printing machine.

This method of producing printing plates is advantageous because it is direct to plate without the use of intermediate films, images, messy chemical development, or the use of silver. In addition the ablatable compositions of the current invention are not sensitive to daylight and possess good shelf-life characteristics.

One class of thermo-resist compositions for use in the invention, and which operate as positive-working thermo-resists, are compositions which are formulated so as to ablate as a result of exposure to the thermal energy (e.g., exposure to a high intensity thermal beam, suitably one emitted by a high intensity thermal laser). Thermo-resists of this type preferably comprise suitable organic resist substances in which have been suspended metal-based, carbon or other finely-divided particles. These particles aid in the absorption of the directed thermal energy resulting in evaporation or volatilization of the film composition. See N. P. Fnrzikov et al, Khim.Fiz 9, 1354 (1990). Thus, when a film of such thermo-resist composition is applied over a surface and a focused beam of thermal energy then used to scan the film according to a desired pattern, and without use of a phototool, those film areas exposed to the beam will ablate and directly reveal the underlying surface. Those film areas not exposed to the beam will thus remain on the substrate surface to serve as the appropriate pattern of resin for the desired purpose (e.g., etch resist in PCB fabrication).

The other class of thermo-resists for use in the invention, and which can be formulated so as to be positive- or negative working, are compositions which undergo a thermally-induced chemical transformation effective to make them more soluble or less soluble in a particular developer. With films formed from these thermo-resists, the scanning of the film with the thermal energy beam in a particular pattern, without use of a phototool, brings about highly localized solubility-increasing or solubility-decreasing compositional changes confined to the areas exposed to the beam, with result that the film carries a latent image of the exposure pattern. Subsequent contact with an appropriate developer then produces the desired pattern of composition.

Positive thermo-resists of this type can be those in which bonds in the polymeric and/or non-polymeric molecules of the composition are broken as a result of heat exposure. As such, selective heat exposure causes the so-exposed areas to become differentially more soluble in developer than the intact composition areas not so exposed to the heat energy. Examples of such positive thermo-resists which can be used in the process of the invention are those comprising phenolic polymers and/or monomers, in which free hydroxyl groups are protected, and an acid or a substance which may release an acid upon heating. The change in the solubility of these organic compositions following heating is a result of the tendency of certain protecting groups to leave the molecule upon heating in the presence of acid catalysis, e.g., acid cleavage of ethers, hydrolysis of esters in the presence of an acid, or the like.

Particular examples of such polymers which can be included in positive thermo-resists are phenolic polymers of the novolac family (products of the condensation of phenol or cresol with formaldehyde in an acid catalysis) such as epoxy-novolac (reaction products between novolacs and epichlorohydrin), or poly (vinylphenols) (obtained by cationic or radical polymerization). The hydroxyl protecting groups may be ethers, such as alkyl-, benzyl-, cycloalkyl- or trialkylsilyl-ethers, and oxy-carbonyl groups.

Negative thermo-resists can be based upon a thermally-induced polymeric cross-linking reaction. As such, selective heat exposure causes the so-exposed areas to become differentially less soluble in developer than the intact composition areas not so exposed to the activating heat energy.

Negative thermo-resists which can be used in the process of the invention may be of two general types. Resists of the first type comprise a polymer such as epoxy resin or epoxy-novolac resin, aliphatic- aromatic-, or heteroaromatic-polyamine resin as a cross-linking agent and an acid or a compound which releases an acid upon heating. Examples of the cross-linking agent that may be used according to the present invention include diethylene triamine, triethylene tetramine, tetraethylene pentaamine, diethylene propylamine, o-, m- and p- phenylene diamine, bis (4-aminophenyl methane), bis (4-aminophenyl), ether, 2-methyl-imidazole, 2-ethyl-4-methyl imidazole and 1-benzyl-2-methyl imidazole.

The second type of negative thermo-resists that may be used in accordance with the present invention comprise a novolac polymer, a photoinitiator which generates acid upon exposure to actinic radiation and a cross-linking agent capable of reacting with novolac polymers when heated in the presence of an acid. Examples of such photoinitiators are esters or amides of 2-diazo-1,2-naphthoquinone-4-sulfonic acid, o-nitroben zaldehydes and esters derived from nitrobenzyl alcohol, of -haloacylphenons, onium salts such as chlorides, bromides and iodides of onium bases of elements in group VA, VIA or VIIA of the Periodic Table and methane-sulfonate esters of aromatic compounds. Examples of cross-linking agents which may be used in this type of negative thermo-resist composition are hexamethylmelamine alkylethers, resols (products of the condensation of phenol or cresols with formaldehyde in a base catalysis), 2,6-bis (hydroxymethyl)4-methyl phenol and epoxy resins. When a composition of this type is used, the process also includes the initial step of a non-selective flood exposure of the film to actinic radiation (without the use of phototools). This flood exposure causes the included photoinitiator to generate the acid (and acid environment) necessary to allow the subsequent thermally-induced chemical transformation of the film composition upon exposure to appropriate heat energy, i.e., to catalyze the thermally-induced cross-linking reactions. The creation of the acid environment also serves to render those composition film portions not heat exposed acidic enough for aqueous-base development.

In order to increase the sensitivity of these resist compositions in general to infrared radiation, the prior art had taught that the resist compositions should contain carbon black or metallic particulate of some type. See for example U.S. Pat. No. 5,310,869 where the silicone polymer compositions contained tungsten oxide, manganese oxide or carbon black. In contrast, the inventors of the current invention have discovered that optimum sensitivity is achieved with the incorporation of certain dye materials such as Projet 860 NP (available from Zeneca Specialties). Projet 860 NP and dyes of its kind generally have maximum absorption at 840–880 nonometers. Dyes such as Projet 860 NP increase the I.R. sensitivity of the resist compositions. When these dyes such as Projet 860 NP are used in conjunction with dark colored dyes such as Nigrosin (available from Aldrich) optimum sensitivity is achieved.

In addition to dyes, the inventors have found that the choice of polymeric binder has an effect on the I.R. sensitivity of the composition. Optimum sensitivity is achieved when using an acidic styrene-maleic-anhydride polymer, such as Scripset 550 available from Monsanto Company of New York, together with acrylic based monomers such as SR 454 and SR 368 available from Sartomer Company. This combination of styrene-maleic-anhydride copolymer and acrylic monomers is proposed for use in place of and instead of such ingredients as polyvinyl phenol, PMMA, epoxy novolacs, epoxy-carboxy acrylates and polystyrenes. Although the former compounds can be made to work in formulating I.R reactive resists and coatings the use of styrene-maleic-anhydrid copolymers in combination with acrylic monomes provides superior sensitivity.

In certain applications such as in the production of printing plates, it may be required for the resist to be resistent to alcohol. This requirement arises out of the necessity or expedience of cleaning the printing plates with alcohols during the production of said plates. The resit film is typically wiped with alcohol after scanning with the I.R. Beam with the requirement that unscanned areas be unaffected by this procedure. Alcohol resistance can be imparted to I.R. resists composed of styrene-maleic-anhydride copolymers and acrylic monomers, if particular crosslinking agents are utilized. The inventors have found peroxides and epoxy resins to be particularly useful in this regard.

For those thermo-resists of the foregoing types, i.e., those not based upon ablation, the selective heat exposure is, of course, then followed by contact of the film with an appropriate developer which removes from the substrate surface the composition film portions which have been rendered differentially more soluble in such developer by reason of the heat imaging (i.e., the heat-exposed areas for a positive-working thermo-resist or the non-heat-exposed areas for a negative-working thermo-resist). Any number of suitable types of developer can be employed, such as organic solvents, oil-in-water or water-in-oil emulsions, in particular micro-emulsions, basic aqueous solutions of alkali metal salts (e.g., hydroxides, carbonates) and the like.

It will be appreciated that the surface to which the thermo-resist composition is applied as a film preferably will be pretreated in appropriate manner in order to obtain optimal adhesion of the composition thereto. Where the substrate surface is highly reflective, measures also should be taken to avoid adverse effects which may be caused by reflection of the thermal energy beam. To reduce reflectivity and maximize the thermal absorption of the film composition, one may resort to use of appropriate fillers in the composition to decrease its transparency.

As previously noted, the preferred focused source of heat energy will be a thermal laser capable of producing thermal energy, such as a laser diode, carbon dioxide laser, or Neodynium-Yag laser. The output of the $CO_2$ laser lies in the infrared and the highest gain transition is at 10.6 micro meters. The Neodynium-Yag lasers are capable of operation at high average power levels, at the wavelength of 1.06 micro meters. Laser diodes typically operate near 0.8 micro meters. Although the foregoing thermal energy sources are preferred, any other appropriate means of providing for any given composition the requisite thermal energy in a focused manner sufficient for the degree of line definition required for any particular purpose can be employed. For industrial-scale production of, e.g., PCBs or printing plates, where speed of processing can be of decided importance, it generally will be the case that the choice of thermal energy source will be one having the highest possible intensity such that the required thermally-induced chemical transformations of the thermo-resist composition film occur in very rapid manner.

By reason of the present invention there is provided a direct imaging process, e.e., one without the use of phototools, which possesses all the inherent advantages of direct imaging but which is not plagued by the associated problems heretofore exhibited by direct image processes which rely solely upon photoresist compositions and expensive lasers. Thus, the process avoids the time and expense of phototool preparation and the defects which may occur in the artwork per se or as a consequence of operator handling of the phototool. In contrast to photoresist-based direct imaging processes, however, the present process, through reliance upon thermally-induced reactions rather than solely light-induced reactions, readily enables the use of inexpensive compositions and avoids the short life and slow speeds associated with the UV or Deep UV lasers required when using photoresist compositions. For PCB fabrication in particular, the present invention enables realization of the current industry direct imaging goal of scanning in 20–30 seconds or less an 18"/24" coated panel with cost-effective lasers.

In addition, by providing a process based upon thermolysis (i.e., in which chemical changes are due to heat) rather than photolysis (i.e., in which chemical changes are due solely to light), the invention enables utilization of varieties of thermo-resist compositions whose chemistry may be tailored to obtain optimal results. The thermo-resist composition may be based on simple non-expensive polymers such as epoxy polymer which is the preferred constituent of the dielectric substrates and of solder masks of PCBs.

Finally, the process of the present invention allows the use of essentially aqueous developing solutions, which in itself is a highly desirable object for protecting the environment.

The process of the present invention is further illustrated hereinafter with reference to some non-limiting specific Examples.

EXAMPLE 1

A positive thermo-resist composition was prepared from the following constituents:

|  | % (w/w) |
| --- | --- |
| poly(vinylphenol) - 100% substituted (with t-butyl oxy carbonyl) | 80 |
| p-toluenesulfonic acid | 5 |
| ethylmethyl ketone (solvent) | 15 |

The p-toluenesulfonic acid was added just prior to use of the composition.

The composition was spin-coated onto a surface of a copper substrate to achieve a layer of about 15 micro meters thickness. Spin-coating was done at 2000 rpm for 20 seconds. The film was then dried by an air current and scanned, in a predetermined pattern dictated by a CAD device, by an IR beam from a Neodynium-Yag laser emitting light at 1.06 micro meters at a scanning speed of approximately 2000 millijoules/$CM^2$. Following scanning, the film was developed by immersing the board in an aqueous solution of 1% NaOH for 60 seconds, resulting in removal from the copper substrate of those film composition areas heat-activated by the IR beam, and achievement of a well defined resist pattern made up of the film composition areas remaining on the substrate.

EXAMPLE 2

A negative thermo-resist composition was prepared from the following constituents:

|  | % (w/w) |
| --- | --- |
| Epoxy resin DEN 438 ™ | 32 |
| sorbic acid | 8 |
| cyclohexanone (solvent) | 59 |
| phenylene diamine (cross-linking agent) | 1 |

The phenylene diamine was added just prior to use of the composition.

The composition was applied onto the copper surface of a board and a uniform film of about 15 micro meters thickness was obtained by spinning. The film was then dried using an air current, scanned by an IR laser as in Example 1 at a rate of 150 millijoules/CM$^2$ and then developed by immersion in cyclohexanone for 60 seconds to effect removal from the substrate of the film composition areas not heat activated by the IR beam. A clearly defined resist pattern was obtained from the heat activated film composition areas remaining on the substrate.

EXAMPLE 3

A negative thermo-resist composition was prepared from the following ingredients:

|  | % (w/w) |
|---|---|
| Quatrex 2410 | 9.5 |
| poly(vinylphenol) | 28.3 |
| sorbic acid | 4.7 |
| phenylene diamine | 0.8 |
| cyclohexanone | 56.7 |

The phenylene diamine was added just prior to use of the composition.

The phenylene diamine was added just prior to use of the composition.

The process of Example 2 was repeated except for the development which in this case was performed by immersion in a micro emulsion of:

|  | % (w/w) |
|---|---|
| cyclohexanone | 18.4 |
| Pluronic L-64 | 1.2 |
| oleic acid | 0.4 |
| water | 80.0 | for 2.5 minutes at 35° C. A satisfactory pattern was achieved.

for 2.5 minutes at 35° C. A satisfactory pattern was achieved.

EXAMPLE 4

The procedure of Example 3 was repeated but with a negative thermo-resist in which methacrylic acid was used in place of the sorbic acid.

The developer used in this example was an aqueous solution of 2% NaOH (90 seconds at 40° C.). A well defined pattern was obtained.

EXAMPLE 5

A negative thermo-resist composition was prepared by mixing the following constituents:

|  | % (w/w) |
|---|---|
| Novolac Resin | 6 |
| ester of 2-diazo-1,2-naphthoquinone-4-sulfonic acid with trihydroxy-benzophenone (photosentizer) | 4 |
| poly(vinylphenol) | 30 |
| 2,6-bis(hydroxymethyl)-4-methylphenol (cross-linking agent) | 3 |
| solvent* | 57 |

*a 3:2 mixture of propylene glycol mono-methyl ether acetate and n-butanol

A copper board was coated by spinning with the above composition to obtain a uniform layer of about 20 micro meters thickness in a similar manner to that described in Example 1. The film was then dried in an oven at 90° C. for 30 minutes and flood exposed to a broad band UV radiation for 2 minutes. The film was then scanned by a thermal (IR) laser (the same laser as in Example 1) beam at a rate of 150 millijoules/CM$^2$ and developed by an aqueous solution of 1% KOH for 75 sec. A satisfactory pattern was achieved.

EXAMPLE 6

A positive thermo-resist was prepared by admixing:

|  | % (w/w/) |
|---|---|
| Maruzen 5000 -t-BPC | 46.6 |
| Benzoyl peroxide | 6.7 |
| Diphenyl iodonium hexafluorophosphate | 6.7 |
| Methyl ethyl ketone | 40.0 |

Maruzen 5000 is poly(vinylphenol) having a molecular weight of about 5000, and was 100% substituted with t-butyloxycarbonyl.

This composition was spin-coated onto a copper substrate surface to a thickness of 20 micro meters and then dried by an air current. A UV laser was used to scan the film in a predetermined (CAD-directed) pattern (a deep UV laser also would be suitable), with result of causing the onium salt to generate acid at the film composition areas exposed to the UV radiation. Thereafter, the thermal laser of Example 1 scanned the film in the same pattern used for the UV laser, with result that the heat-activated areas underwent acid-catalyzed breaking of bonds of the t-BOC. The heat-activated areas were then removed from the substrate using an aqueous solution of 1% NaOH (60 seconds).

It should be appreciated that the foregoing process can be modified by elimination of the UV laser, and reliance solely upon the thermal laser to generate acid from the onium salt (in the presence of benzoyl peroxide or any other oxidizing or reducing agent) as well as then to bring about the acid-catalyzed bond breaking of the t-BOC.

EXAMPLE 7

A negative thermo-resist suitable for use as a solder mask was prepared by first admixing the following components in the indicated weight percentages:

|  | % (w/w) |
|---|---|
| Butyl carbitol | 33.0 |
| Cellosolve acetate | 1.6 |
| Epoxy resin | 50.0 |
| Colorant | 4.5 |
| Silica | 5.0 |
| Water | 4.3 |

Prior to use, this first composition was admixed with methyl dianiline (8% w/w). The resultant liquid composition was curtain coated onto a patterned printed circuit to a film thickness of about 20 micro meters, and then dried by an air current. The film was then scanned in a CAD-directed pattern using the thermal laser of Example 1, at a rate of 150 millijoules/CM$^2$ mm/second, such that all surface areas of the film-coated printed circuit other than areas constituting through-hole surfaces, surrounding pads and lands were exposed to the laser. By development with butyl carbitol, the film areas which were not exposed to the laser were removed, with result that the composition film areas remaining formed the desired solder resist pattern.

EXAMPLE 8

A thermo-resist composition was prepared by admixing the following components in the indicated weight percentages.

|  | % (w/w) |
|---|---|
| Maruzen 5000 -t-BOC (100%) | 20.0 |
| Dipenyl Iodonium Hexafluoro Phosphate | 5.0 |
| Quatrex 2410 | 33.0 |
| Cyclohexanone | 29.0 |
| Methyl ethyl ketone | 13.0 |

This liquid composition was spin coated onto a copper-clad PCB material to a film thickness of about 20 micro meters, and then dried in an air current. The film was then scanned in a CAD-directed pattern using the thermal laser of Example 1 at a rate of 150 millijoules/CM$^2$, with result that the film areas exposed to the laser were completely ablated from the copper surface. The film areas not exposed to the laser remained on the copper surface in a clearly defined resist in the desired pattern.

EXAMPLE 9

A thermo-resist composition was prepared from the following constituents:

|  | % (w/w) |
|---|---|
| Styrene-Maleic-Anhydride Copolymer (Scripset 550) [1*] | 10 |
| Acrylic monomer/oligomer (SR454) [1*] | 3 |
| Acrylic monomer/oligomer (SR368) [1*] | 3 |
| Lauroyl Peroxide | 2 |
| I.R. Absorbing dye (Projet 860 NP) [2] | 2 |
| Colored Dye (Nigrosin) [3] | 2 |
| Plasticizer (Modaflow) [4] | 0.5 |
| Methyl Ethyl Ketone | 77.5 |

Notes:
[1*] Available from Monsanto Company
[2] Available from Zeneca Specialties
[3] Available from Aldrich
[4] Available from Monsanto Company The composition was coated onto a surface of a polyester printing plate substrate to achieve a layer of about 3 microns thickness. The film was then dried at 150° C. and scanned, in a predetermined pattern dictated by a CAD device, by an I.R. beam from a diode laser emitting light at 870 nm at a scanning speed of 500 mm/second (100 millijoules/CM$^2$). The scanning completely ablated the areas scanned. The scanned surface was then wiped with ethanol to remove debris. An acceptable printing plate was thereby formed.

What is claimed is:

1. A direct process for producing an imaged pattern on a substrate surface, comprising the steps of:
   (a) applying to said surface a film of a thermo-resist composition, which composition has the property of undergoing a thermally-induced transformation effective to increase or decrease its solubility in a particular developer;
   (b) thereafter, directing to selected areas of said film, corresponding to the positive or negative of the desired resist pattern, a focused beam of infrared energy effective to bring about in said composition the said thermally-induced transformation, without an initial step of non-selective flood exposure of said film to actinic radiation; and
   (c) thereafter contacting said film with a developer effective to selectively remove from said substrate surface those areas of said composition which, by reason of said transformation are differentially more soluble in said developer;
   wherein the thermo-resist composition comprises:
      (1) an infrared absorbing dye;
      (2) a polymer selected from the group consisting of styrene-maleic anhydride copolymers; and
      (3) acrylic monomers or oligomers.

2. The process according to claim 1 wherein the infrared absorbing dye has a maximum absorption at about 840 to 880 nm.

3. The process according to claim 1 wherein said thermo-resist composition is resistant to alcohol.

4. A process for producing a printing device comprising the steps of:
   (a) casting a film of a thermo-resist composition, which composition has the property of undergoing a thermally-induced transformation effective either to ablate the composition, or to increase or decrease its solubility in a particular developer;
   (b) thereafter directing to selected areas of said film, corresponding to the positive or negative of the desired resist pattern, a focused beam of infrared energy effective to thereby bring about in said composition the said thermally-induced transformation, without an initial step of non-selective flood exposure of said film to actinic radiation; and
   (c) where the thermally-induced transformation is other than ablation, thereafter contacting said film with a developer effective to selectively remove from said substrate surface those areas of said composition which, by reason of said transformation are differentially more soluble in said developer;
   wherein the thermo-resist composition comprises:
      (1) an infrared absorbing dye;
      (2) a polymer selected from the group consisting of styrene-maleic anhydride copolymers; and
      (3) acrylic monomers or oligomers.

5. The process according to claim 4 wherein the infrared absorbing dye has a maximum absorption at about 840 to 880 nm.

6. The process according to claim 4 wherein said thermo-resist composition is resistant to alcohol.

* * * * *